United States Patent
Yu et al.

(10) Patent No.: US 7,271,474 B2
(45) Date of Patent: Sep. 18, 2007

(54) METHOD AND INTEGRATED CIRCUITS OF MODULE PACKING

(75) Inventors: Gordon Yu, Taipei (TW); Hung-Tse Ho, Taipei (TW); Yi-Hua Ho, Kaohsiung (TW); Ming-Che Chang, Tainan (TW)

(73) Assignee: C-One Technology Corp., Hsin-Chu (TW)

( * ) Notice: Subject to any disclaimer, the term of this patent is extended or adjusted under 35 U.S.C. 154(b) by 103 days.

(21) Appl. No.: 11/111,727

(22) Filed: Apr. 22, 2005

(65) Prior Publication Data
US 2006/0118930 A1 Jun. 8, 2006

(30) Foreign Application Priority Data
Dec. 3, 2004 (TW) .............................. 93137403 A

(51) Int. Cl.
*H01L 23/02* (2006.01)
(52) U.S. Cl. ....................................... 257/678; 257/679
(58) Field of Classification Search ................ 257/678, 257/679

See application file for complete search history.

(56) References Cited

U.S. PATENT DOCUMENTS

2003/0235040 A1\* 12/2003 Liu et al. ..................... 361/737
2005/0279838 A1\* 12/2005 Wang et al. ................. 235/492

\* cited by examiner

*Primary Examiner*—Roy Potter
(74) *Attorney, Agent, or Firm*—Bacon & Thomas, PLLC

(57) ABSTRACT

The present invention provides a modular packing integrated circuit card and its manufacturing method. The above modular packing integrated circuit card comprises a shell, a composite chip unit, and a switch card with a specific interface format. The switch card has a predetermined space for locating the composite chip unit, and enabling the predetermined pins of the composite chip unit to be connected with the predetermined lines of the switch card. The switch card further includes an interface device for a specific interface format so as to connect with the predetermined lines. Finally, the switch card is fastened in the shell. Consequently, the composite chip unit can be manufactured as different interface formats by using different switch cards, such that different interface formats are easier to be exchanged with each other.

5 Claims, 2 Drawing Sheets

METHOD AND INTEGRATED CIRCUITS OF MODULE PACKING

BACKGROUND OF THE INVENTION

1. Field of the Invention

The present invention relates to an integrated circuit (IC) card and its manufacturing method, and more particularly, to a modular packing integrated circuit card and its manufacturing method.

2. Description of Related Art

Currently, the marketplace is full of products with a variety of interfaces, such as the Universal Serial Bus (USB) interface, Secure Digital (SD) interface, Multimedia Card (MMC) interface, Subscriber Identity Module (SIM) interface, and so on, wherein these interfaces are applied to different devices, including personal computers, digital cameras, movable drives, or the like. Take the memory card for example, the customer needs different kinds of memory cards for different devices, such as using the USB interface memory card for the computer, or using the SD interface memory card for the digital camera. Consequently, the manufacturers have to prepare various types of memory cards in advance in order to meet customer's requirement. However, since those interface cards are hard to be exchangeable with each other during the manufacturing process, it's difficult to control the inventory such that some memory cards are often out of stock while others are over manufactured. It's a huge burden and quite inconvenient to the manufacturers.

Therefore, it is desirable to provide an improved modular packing integrated circuit card and its manufacturing method to mitigate and/or obviate the aforementioned problems.

SUMMARY OF THE INVENTION

The modular packing integrated circuit card of the present invention comprises a shell, a composite chip unit, and a switch card with a specific interface format. The composite chip has a plurality of predetermined pins and at least one chip coupled to the predetermined pins. The above switch card is disposed in the shell, and includes an interface device for the specific interface format and a predetermined space for locating the composite chip unit. The switch card further has a plurality of predetermined lines for correspondingly connecting the interface device and the predetermined pins of the composite chip unit. Consequently, modular packing integrated circuit cards with different interface formats can be manufactured from the same composite chip unit by replacing switch cards with different specific interface format during the manufacturing process.

Further, the shell comprises a first cover and a second cover, and the aforementioned switch card with the specific interface format is fastened between the first cover and the second cover. The fastening method is selected from binding, locking, ultrasonic bonding, and any other equivalent fastening method.

In addition, the specific interface format can be a Universal Serial Bus (USB) interface, a Secure Digital (SD) interface, a Multimedia Card (MMC) interface, a Subscriber Identity Module (SIM) interface, or other interface formats for various electronic equipments. The switch card further comprises a switch circuit for switching electronic signals of the predetermined pins and the specific interface.

The present invention further provides a modular packing method for manufacturing an integrated circuit card comprising the following steps: (A) providing a composite chip unit including a plurality of predetermined pins and at least one chip coupled to the predetermined pins; (B) selecting a switch card with a specific interface format, the switch card having an interface device for the specific interface format, a predetermined space, and a plurality of predetermined lines for correspondingly connecting to the interface device; (C) locating the composite chip unit in the predetermined space of the switch card such that the plurality of predetermined pins of the composite chip unit are correspondingly connected to the predetermined lines of the switch card; and (D) fastening the switch card in a shell. Integrated circuit cards with different interface formats can be manufactured from the same composite chip unit by selecting switch cards with different interface formats in step (B). Such that the inconvenience of exchanging integrated circuit cards with different interface formats with each other can be improved.

Furthermore, step (D) comprises the steps of: (D1) associating the switch card with a second cover, and associating a first cover with the switch card; and (D2) jointing the first cover and the second cover by binding or ultrasonic bonding.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
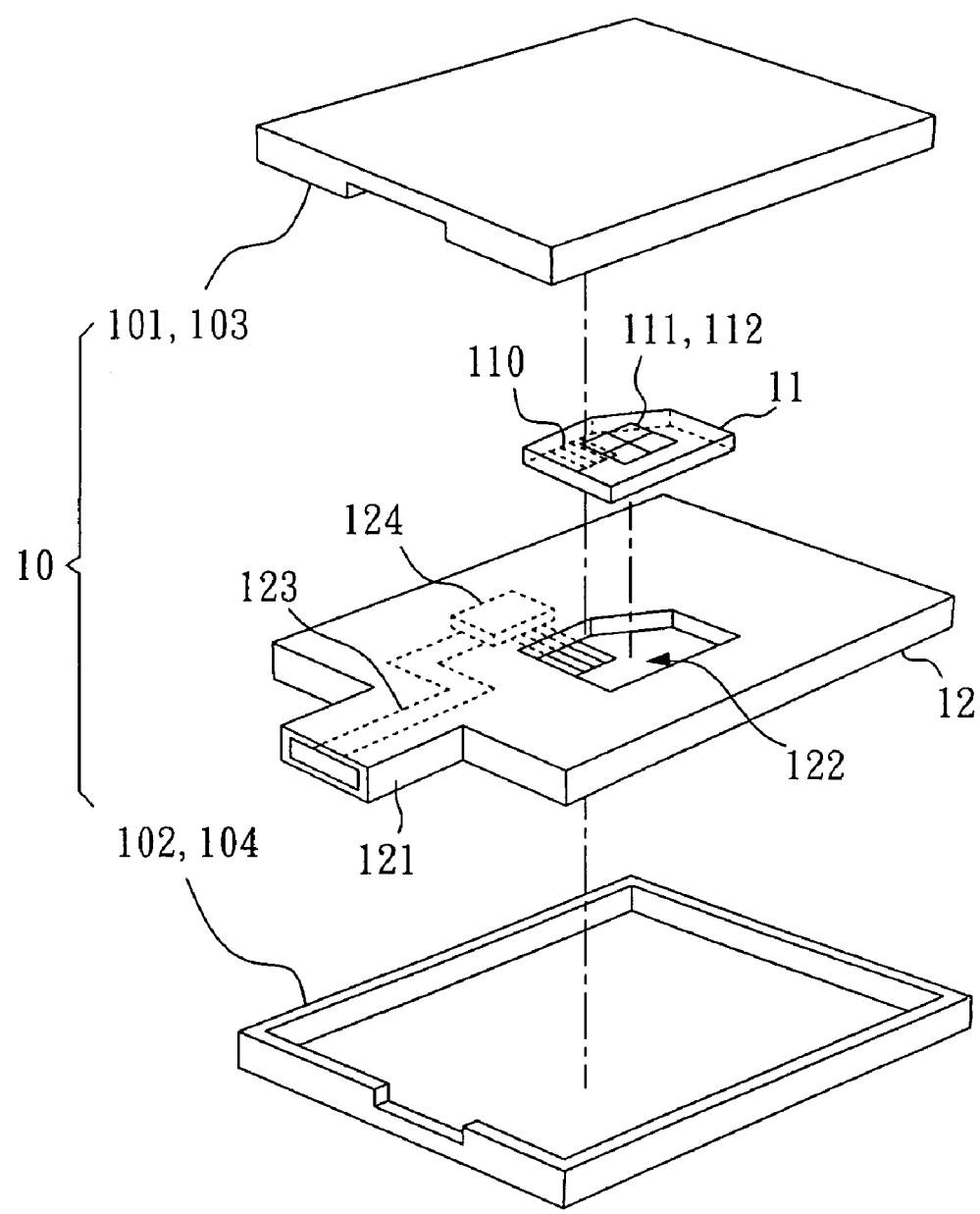
FIG. 1 is an exploded view of the preferred embodiment according to the present invention.

Please refer to FIG. 1. FIG. 1 is an exploded view of the preferred embodiment according to the present invention. As shown in FIG. 1, this embodiment comprises: a shell 10, a composite chip unit 11, and a switch card 12 with a specific interface format. The composite chip unit 11 has a plurality of predetermined pins 110 and a chip 111 coupled to the predetermined pins 110. In this embodiment, the chip 111 is a flash memory chip 112. The switch card 12 with the specific interface format is disposed in the shell 10, and includes a predetermined space 122 just for locating the composite chip unit 11. The switch card 12 further has a switch circuit 124, an interface device 121 (i.e. a Universal Serial Bus (USB) as shown in FIG. 1) for the specific interface format, and a plurality of predetermined lines 123 for correspondingly connecting the interface device 121 and the predetermined pins 110 of the composite chip unit 11. The electronic signals of the predetermined pins 110 and the electronic signals of the specific interface are exchangeable with each other through the switch circuit 124, and can be transmitted via the plurality of predetermined lines 123.

The abovementioned shell 10 comprises a first cover 101 and a second cover 102. In this embodiment, the first cover 101 is an upper cover 103, and the second cover 102 is a lower cover 104. The switch card 12 with the specific interface format is fastened between the first cover 101 and the second cover 102.

Figure 2:
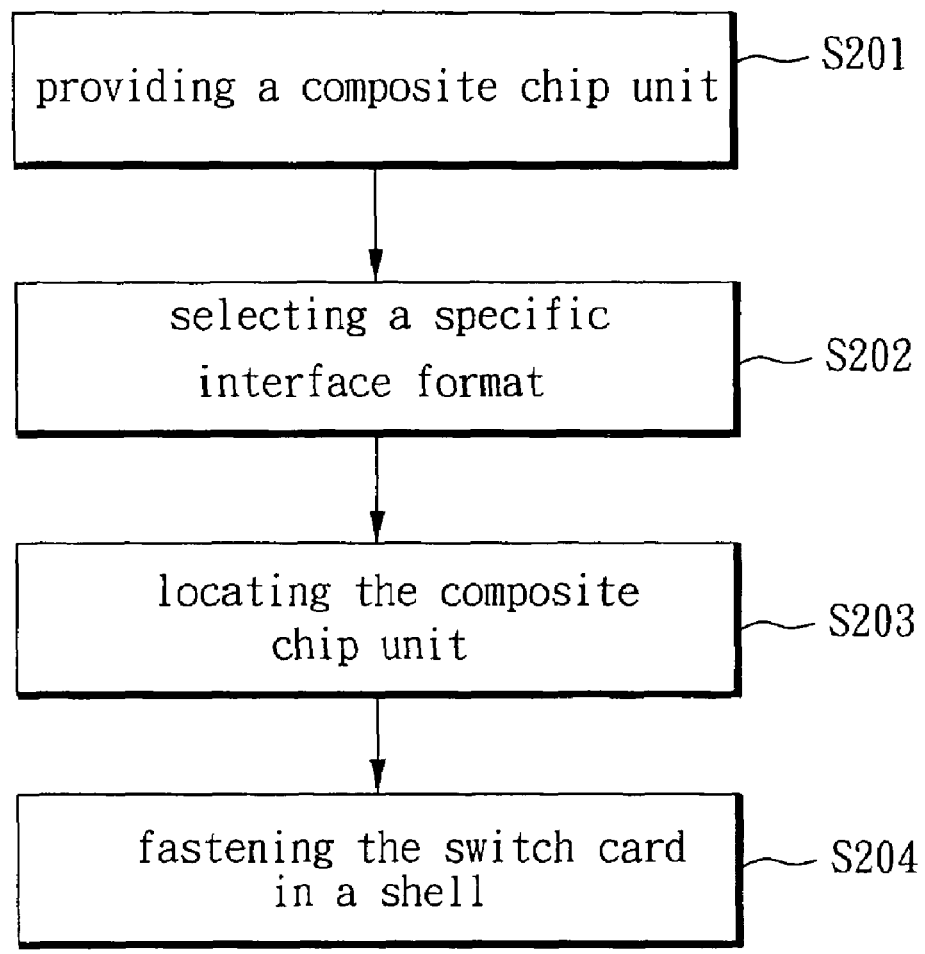
FIG. 2 is a flowchart of the preferred embodiment according to the present invention.

With reference to FIG. 2, it illustrates a flowchart for modular packing the integrated circuit card of the preferred embodiment according to the present invention. At first, a composite chip unit is provided (S201). The composite chip unit has a plurality predetermined pins and a chip coupled to the predetermined pins, wherein the sizes and locations of these predetermined pins are already designed in advance. Next, a switch card with a specific interface format is selected (S202). The switch card includes an interface device for a specific interface format, such as a Universal Serial Bus (USB) interface, a Secure Digital (SD) interface, a Multimedia Card (MMC) interface, a Subscriber Identity Module (SIM) interface, or other interface devices for various interfaces. Further, the switch card has a predetermined space just for locating the composite chip unit and a plurality of predetermined lines. The aforementioned predetermined lines are connected to the interface device. Then, the composite chip unit is disposed in the predetermined of the switch card such that the plurality of predetermined pins of the composite chip unit are correspondingly connected to the predetermined lines of the switch card (S203). Finally, the switch card is fastened in a shell (S204), wherein the shell is divided into an upper cover and a lower cover. In step S204, at first the switch card is associated with the lower cover, and then the upper cover is associated with the switch card. Then, the first cover and second cover can be jointed by binding or ultrasonic bonding.

According to the description mentioned above, the present invention enables the composite chip unit 11 to be composed with switch cards 12 having different interface formats by modulizing the elements of an integrated circuit card. Therefore, the integrated circuit card manufacturer can select the switch card 12 with a specific interface format based on user's requirement so as to quickly manufacturing integrated circuit cards by merely composing the composite chip unit 11 in the selected switch card 12 thereby reducing the burden of over-manufactured inventory.

Although the present invention has been explained in relation to its preferred embodiment, it is to be understood that many other possible modifications and variations can be made without departing from the spirit and scope of the invention as hereinafter claimed.

What is claimed is:

1. A modular packing integrated circuit card, comprising:
   a shell;
   a composite chip unit having a plurality of predetermined pins and at least one chip coupled to the predetermined pins; and
   a switch card with a specific interface format,
   wherein the switch card is disposed in the shell, and includes an interface device for the specific interface format and a predetermined space for locating the composite chip unit, the switch card further has a plurality of predetermined lines for correspondingly connecting the interface device and the predetermined pins of the composite chip unit, and
   wherein the specific interface format is one of a Universal Serial Bus (USB) interface, a Secure Digital (SD) interface, a Multimedia Card (MMC) interface, or a Subscriber Identity Module (SIM) interface.

2. The modular packing integrated circuit card as claimed in claim 1, wherein the shell comprises a first cover and a second cover, and the specific interface format switch card is disposed between the first cover and the second cover.

3. The modular packing integrated circuit card as claimed in claim 2, wherein the first cover is an upper cover, and the second cover is a lower cover.

4. The modular packing integrated circuit card as claimed in claim 1, wherein the chip of the composite chip unit is a flash memory chip.

5. The modular packing integrated circuit card as claimed in claim 1, wherein the switch card with the specific interface format further comprises a switch circuit for switching electronic signals of the predetermined pins and the specific interface.

\* \* \* \* \*